(12) United States Patent
Zambrano

(10) Patent No.: US 6,410,404 B1
(45) Date of Patent: Jun. 25, 2002

(54) PROCESS FOR MANUFACTURING SOI INTEGRATED CIRCUITS AND CIRCUITS MADE THEREBY

(75) Inventor: Raffaele Zambrano, Viagrande (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/561,272

(22) Filed: Apr. 28, 2000

(30) Foreign Application Priority Data

Apr. 30, 1999 (EP) .............................. 99830262

(51) Int. Cl.⁷ .................. H01L 21/76; H01L 21/44
(52) U.S. Cl. .................. 438/429; 438/442; 438/607
(58) Field of Search .................. 438/351, 360, 438/363, 388, 416, 413, 429, 442, 481, 607

(56) References Cited

U.S. PATENT DOCUMENTS

| | | | | |
|---|---|---|---|---|
| 4,473,598 A | * | 9/1984 | Ephrath et al. | 427/86 |
| 4,654,958 A | | 4/1987 | Baerg et al. | 29/571 |
| 5,422,299 A | | 6/1995 | Neudeck et al. | 437/63 |
| 5,457,338 A | * | 10/1995 | Borel | 257/510 |
| 5,904,535 A | * | 5/1999 | Lee | 438/341 |
| 6,140,196 A | * | 10/2000 | Tung | 438/341 |

FOREIGN PATENT DOCUMENTS

| | | | |
|---|---|---|---|
| EP | 0295786 A2 | | 12/1988 |
| JP | 402066947 A | * | 3/1990 |

OTHER PUBLICATIONS

Gilbert et al., "Quasi–Dielectrically Isolated Bipolar Junction Transistor with Sub–Collector Fabricated Using Silicon Selective Epitaxy," *IEEE*, pp. 199–202, 1991.

* cited by examiner

Primary Examiner—John F. Niebling
Assistant Examiner—Viktor Simkovic
(74) Attorney, Agent, or Firm—Lisa K. Jorgenson; Robert Iannucci; Seed IP Law Group, PLLC

(57) ABSTRACT

Presented is a process for manufacturing circuit structures of the SOI type integrated on a semiconductor substrate having a first type of conductivity. The process includes forming at least one well with a second type of conductivity in the semiconductor substrate and forming a hole within the well. The hole is then coated with an insulating coating layer, and an opening is formed through the insulating coating layer at the bottom of the hole. The hole is then filled with an epitaxial layer grown from a seed that was made accessible through the opening in the hole.

20 Claims, 4 Drawing Sheets

US 6,410,404 B1

PROCESS FOR MANUFACTURING SOI INTEGRATED CIRCUITS AND CIRCUITS MADE THEREBY

TECHNICAL FIELD

This invention relates to a process for manufacturing integrated circuit structures of the SOI type, and more specifically, this invention concerns a process for manufacturing SOI power and control circuit structures integrated on a semiconductor substrate having a first type of conductivity.

BACKGROUND OF THE INVENTION

Integrated circuit structures having a Silicon-On-Insulator (SOI) type are formed on insulating substrates, and used to form MOS and CMOS devices having a strong decoupling from the substrate and a vertical insulation from one another.

Several prior art processes exist for forming SOI integrated circuit structures. For example, SOI substrates have been formed by bonding a first substrate, which is covered with an oxide layer, onto a second substrate, so that the oxide layer is sandwiched between the first and second substrates. The joining of the substrates is achieved by a bonding process to silicon which has problems of yield and is only used for high "added value" integrated circuits.

Another prior art process subjects the substrate to implantation with $O_2$ at a very heavy dosage, thereby forming a buried oxide layer. However, this process is cost intensive.

More recent is a proposal for forming SOI substrates from an insulating layer whereon a layer of monocrystalline silicon is grown epitaxially. The epitaxial layer of monocrystalline silicon will later host MOS and CMOS devices. However, growing a substantial epitaxial layer over the surface of the insulating layer has also proved to be fairly critical.

There has yet to be developed a process for manufacturing SOI integrated circuit structures which have such structural and functional features as to manufacture MOS and CMOS devices economically and overcome the drawbacks that still beset prior SOI integrated circuit structures.

SUMMARY OF THE INVENTION

Embodiments of the invention form, on the same semiconductor substrate, both SOI integrated circuit structures, and traditional structures.

Presented is a process for forming at least one well with a second type of conductivity in a semiconductor substrate having a first type conductivity, and forming a hole in the well or wells. The hole is coated with an insulating layer and an opening formed therein at the bottom of the hole. Later, the hole is filled with an epitaxial layer grown from a seed accessible through the opening in the hole.

The features and advantages of a device according to the invention will become clear from the following description of an embodiment thereof, given by way of example and not of limitation with reference to the accompanying drawings. Additionally, although this inventive process is described with reference to a structure comprising both power and control devices, this description is only made for convenience of explanation, and in no way limits the scope of the invention to those devices.

DETAILED DESCRIPTION OF THE INVENTION

A process for manufacturing integrated SOI circuit structures according to embodiments of the invention will now be described with reference to the drawings. The process steps described herein below do not form a complete process for manufacturing integrated circuits. This invention can be used in combination with techniques of integrated circuit manufacturing currently employed in the industry, and only such common process steps as are necessary to an understanding of this invention will be described. Figures showing perspective views of portions of an integrated circuit during its fabrication are no scale drawings, but merely drawn to illustrate the most important features of the invention. Discussion of manufacturing steps or structures well known to those skilled in the art has been abbreviated or eliminated for brevity.

Figure 1:
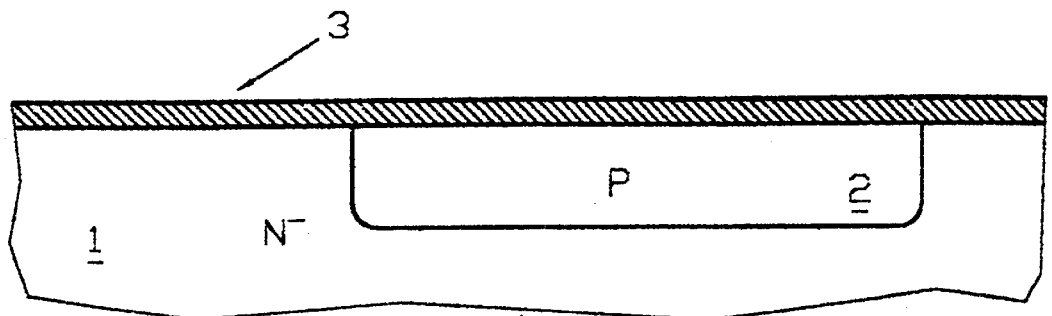
FIGS. 1 to 4 are cross sectional diagrams of a portion of a semiconductor substrate during the manufacturing process of a first embodiment according to the invention.

FIG. 1 illustrates how a well 2 having a second type P of conductivity is formed on a semiconductor substrate I having a first, eg., N-, conductivity type. A protective insulating layer 3 is then provided to cover the entire semiconductor surface.

Advantageously, said insulating layer 3 is a silicon oxide layer, but could be any other suitable insulating layer.

Next, a hole 4 is formed inside the well 2, for example by cascade etching the silicon oxide layer 3 and the P-type semiconductor layer in the well 2. An oxidation step is carried out in order to coat the sidewalls of the hole 4 with an insulating layer 5. The bottom of the hole 4 is also coated with the same insulating layer 5. Advantageously, the insulating layer 5 is a silicon oxide layer, but could be any suitable insulating layer.

Advantageously, at least one opening 6 is formed through the oxide layer 5 by etching away the oxide layer until the P-type semiconductor substrate of the well 2 is exposed.

Figure 2:
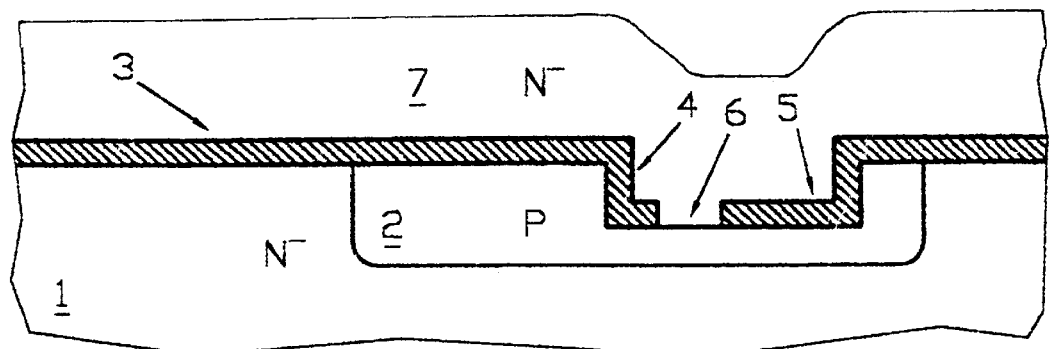

Next, an epitaxial layer 7 is then grown from a "seed" made accessible through the opening 6. In the example being described, this layer 7 is of the N-type and grown to fill up the hole 4 coated with the oxide layer 5. The layer 7 is further grown to cover the oxide layer 3. (FIG. 2)

At this stage of the process, a step of re-crystallizing the epitaxial layer 7 is carried out which is followed by a planarizing step, also effective to remove the protective oxide layer 3. Advantageously, this planarizing step is carried out using a CMP (Chemical-Mechanical Polishing) technique.

Figure 3:
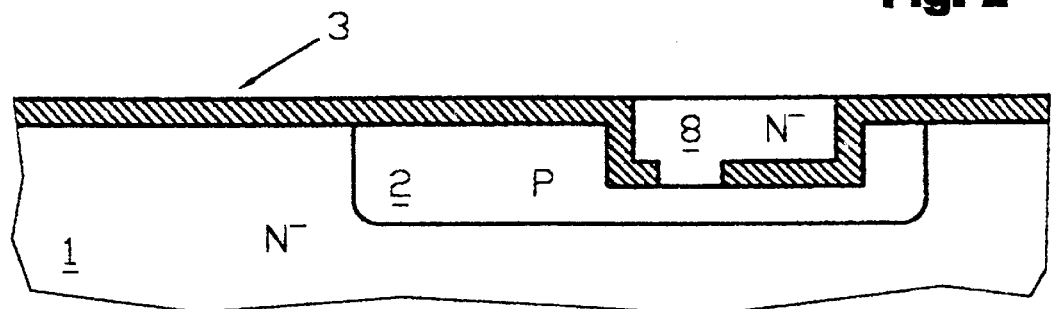

This CMP step confines the epitaxial layer to within the hole 4, thereby defining a region 8 of the N-type inside the well 2 of the P type. (FIG. 3)

Using known techniques to the skilled person in the art, an isolation trench 9 is formed at the opening 6 to complete the isolation of the region 8 from the well 2.

Figure 4:
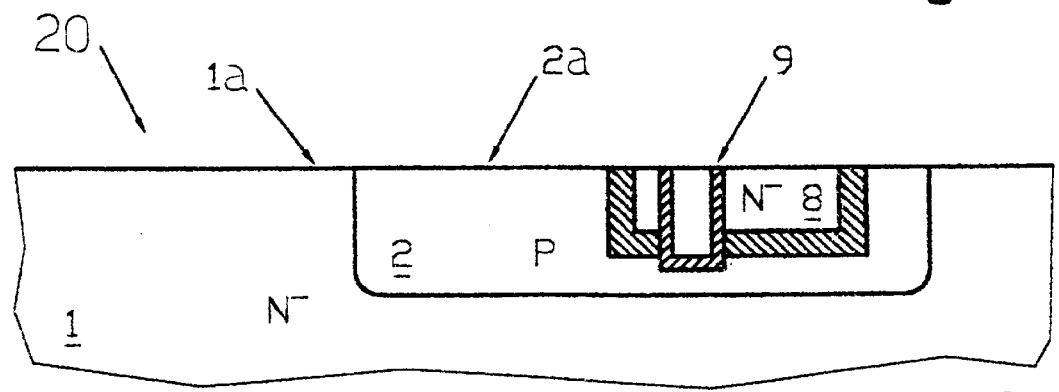

This embodiment creates a circuit structure 20 which can include a substrate portion 1a of the N-type adapted to receive power devices formed with MOS technology, such as doublediffusion vertical power transistors (VDMOS) or isolated gate bipolar transistors (IGBT), a well 2a of the P type for forming N-type transistors, such as NMOS transistors, and a well 8 of the N-type for forming P-type transistors, such as PMOS transistors, this well 8 being isolated from the P-type substrate of the well 2 by an oxide layer 5. (FIG. 4)

FIGS. 5 to 8 illustrate a second embodiment of the inventive process.

In these Figures, regions having the same functions as in the previous embodiment carry the same reference numerals.

Figure 5:
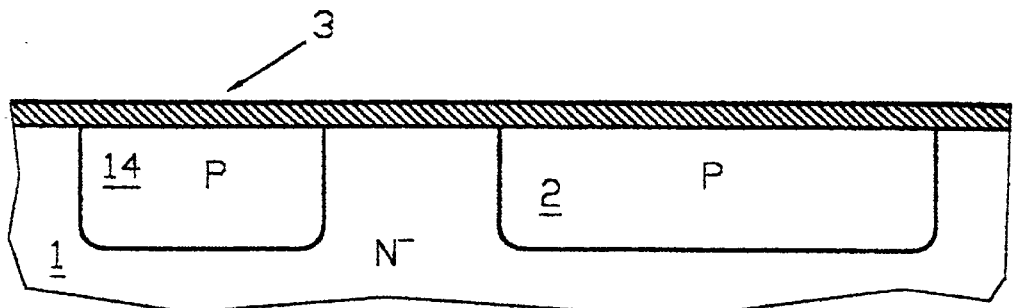
FIGS. 5 to 8 are cross sectional diagrams of a portion of a semiconductor substrate during the manufacturing process of a second embodiment according to the invention.

A first well 2 of the P type and a second well 14 of the P type are formed on a semiconductor substrate 1 of the N-type, as shown in FIG. 5.

A protective insulating layer 3 is formed subsequently all over the semiconductor surface. Advantageously, this insulating layer 3 is silicon oxide, but can be, as above, any suitable insulating layer.

A hole 4 is formed inside the well 2, for example by cascade etching the silicon oxide layer 3 and the P-type semiconductor layer in the well 2.

An oxidation step is carried out in order to coat the sidewalls of the hole 4 with an oxide layer 5.

The bottom of the hole 4 is also coated with the same insulating layer 5.

Advantageously, at least one opening 6 is formed through the oxide layer 5 by etching away the oxide layer 5 until the P-type semiconductor substrate of the well 2 is exposed.

Figure 6:
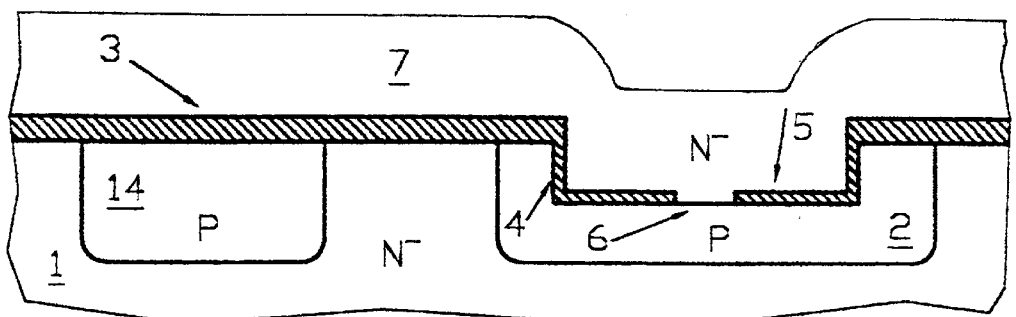

An epitaxial layer 7 is then grown from a "seed" made accessible through the opening 6. In the example being described, this layer 7 is of the N-type and grown to fill up the hole 4 coated with the oxide layer 5. The layer 7 is further grown to cover the oxide layer 3. (FIG. 6)

Figure 7:
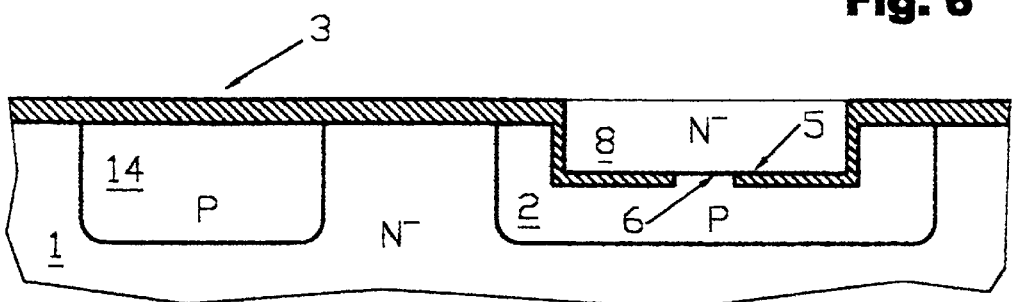

At this stage of the process, a step of recrystallizing the epitaxial layer 7 is carried out which is followed by a planarizing step. Advantageously, this planarizing step is carried out using a CMP (Chemical-Mechanical Polishing) technique. This CMP operation will confine the epitaxial layer to the hole 4 interior, thereby defining a region 8 of the N-type inside the region 2 of the P type. (FIG. 7)

Using known techniques to the skilled person in the art, an isolation trench 9 is formed above the opening 6 to complete the isolation of the region 8 from the well 2.

Figure 8:
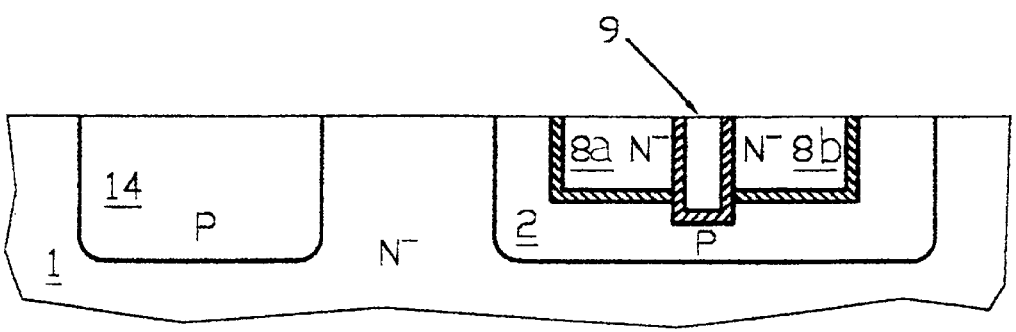

The trench 9 is also effective to split the region 8 into two regions 8a and 8b of the N-type which are isolated electrically from each other, as shown in FIG. 8. Here again, the regions 8a and 8b are adapted to accommodate respective MOS devices, such as PMOS devices.

On the other hand, the second well 14 of the P type is adapted to accommodate MOS transistors of the N type.

Figure 9:
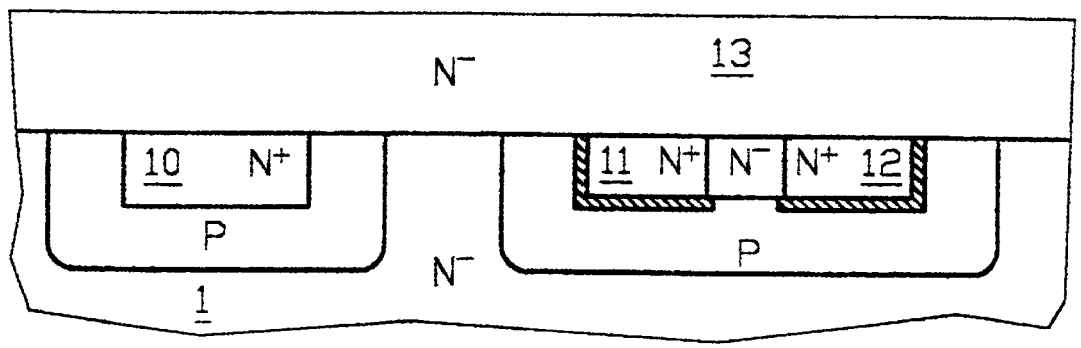
FIGS. 9 and 10 are cross sectional diagrams of a portion of a semiconductor substrate, during the manufacturing process of a third embodiment according to the invention.
Figure 10:
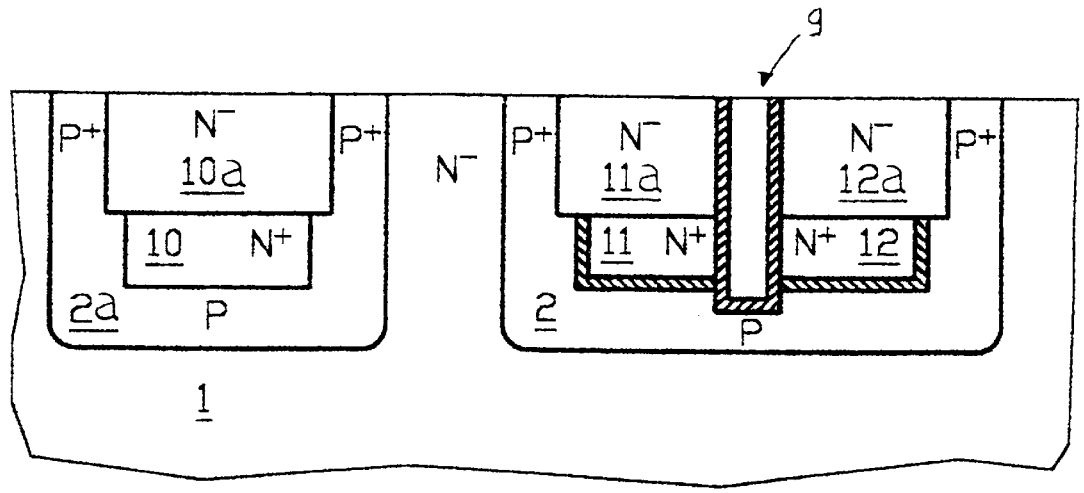

A third embodiment of the inventive process is illustrated by FIGS. 9 and 10.

In this embodiment, the process flow includes, prior to forming the isolating trench 9, the simultaneous formation of at least one well 10 of the N+ type in the region 14 and a pair of wells 11, 12 also of the N+ type.

An epitaxial layer 13 of the N-type is then formed. (FIG. 9)

An implantation of the P+ type is carried out at the peripheries of the regions 2 and 14. At this stage of the process, respective regions 10a, 11a and 12a of the N-type have been formed above of the regions 10, 11 and 12 of the N+ type, as shown in FIG. 10.

Using known techniques to the skilled person in the art, an isolating trench 9 is dug between the regions 11, 11a and the corresponding regions 12, 12a.

In the last-described embodiment, the oxide layer 5 only accommodates the wells 11 and 12.

Advantageously in this embodiment, the formation of a parasitic bipolar transistor of the NPN type is prevented which would have the region 11 of the N+ type for its emitter region, the well of the P+ type for its base region, and the substrate 1 for its collector region.

Shown in FIGS. 11 to 14 is yet another alternative embodiment of the invention.

In this embodiment, a well 102 having a second type N of conductivity is 11 formed on a semiconductor substrate 101 having a first, eg., P-, type of conductivity.

Figure 11:
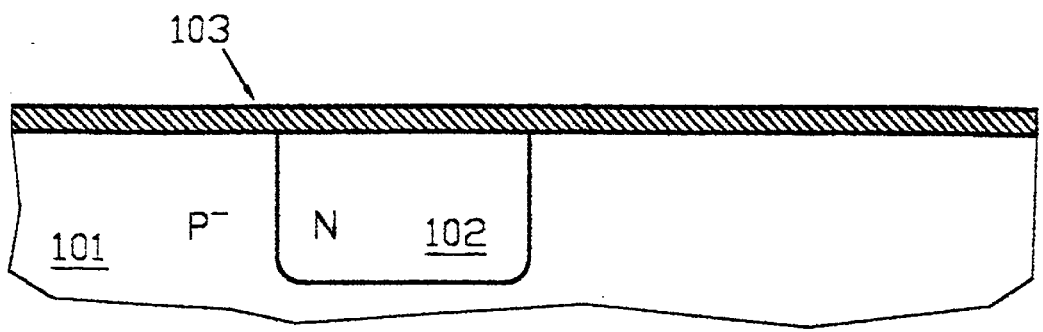
FIGS. 11 and 14 are cross sectional diagrams of a portion of a semiconductor substrate, during the manufacturing process of an alternative embodiment according to the invention.

A protective insulating layer 103 is then formed to entirely cover the semiconductor surface. Advantageously, said insulating layer 103 is a silicon oxide layer, although it could be any suitable insulating layer. (FIG. 11)

A hole 104 is formed in the substrate 101, for example by etching away the oxide layer 103 and the semiconductor layer 101 of the P type.

An oxidation step is carried out in order to coat the sidewalls of the hole 104 with an insulating layer 105. The bottom of the hole 104 is also coated with the same insulating layer 105. Advantageously, the insulating layer 105 is silicon oxide, or another suitable insulator.

Advantageously, at least one opening 106 is formed through the oxide layer 105 by etching away the oxide layer 105 until the semiconductor substrate 101 is exposed.

Figure 12:
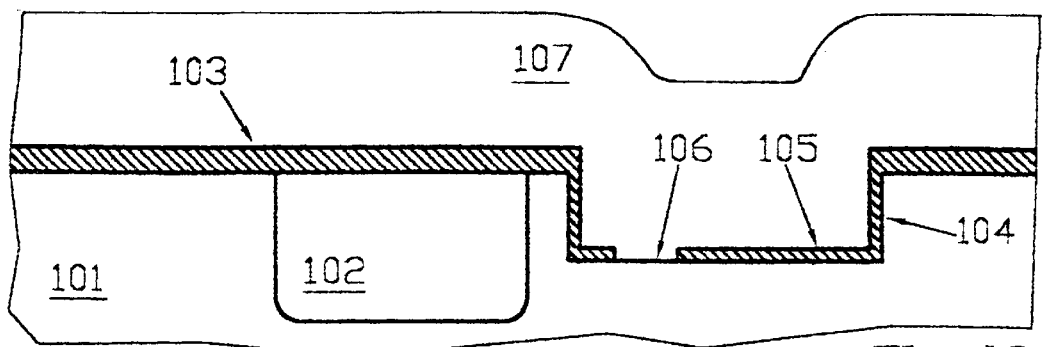

An epitaxial layer 107 is then grown from a "seed" made accessible through the opening 106. In the example being described, this layer 107 is of the P-type and grown to fill up the hole 104 coated with the oxide layer 105. The layer 107 is further grown to cover the oxide layer 103. (FIG. 12)

Figure 13:
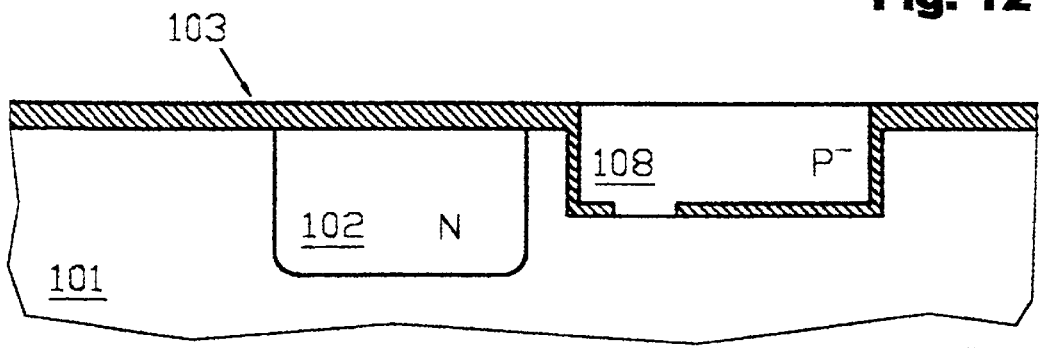
Figure 14:
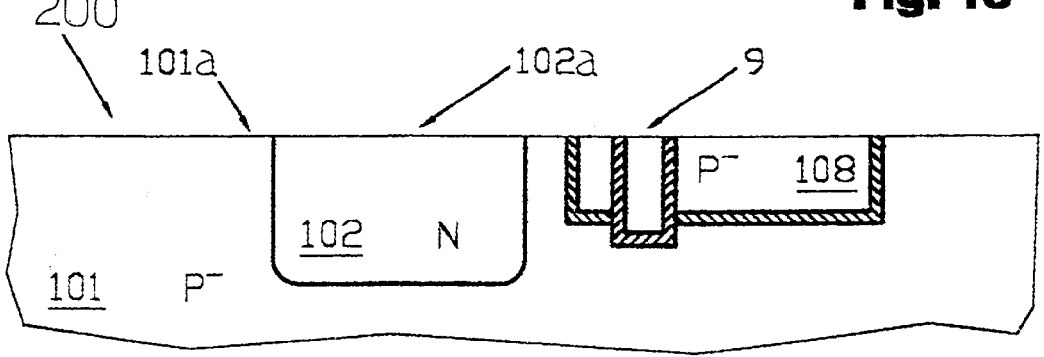

At this step of the process, a step of re-crystallizing the epitaxial layer 107 is carried out, which is followed by a planarizing step, also removing the protective oxide layer 103. Advantageously, this planarizing step is carried out using a CMP (Chemical-Mechanical Polishing) technique. This CMP step is effective to confine the epitaxial layer to within the hole 4, thereby defining a region 108 of the P-type. (FIG. 13).

Using known techniques to the skilled person in the art, an isolation trench 9 is formed above the opening 106 to complete the isolation of the region 8 from the well 2.

The process of this embodiment manufactures a circuit structure 200 which comprises a substrate portion 101a of the P-type adapted to accommodate transistors of the N type, such as NMOS transistors, a well 102a of the N type for forming P-type transistors, such as PMOS transistors, and a well 108 of the P-type for forming N-type transistors, such as NMOS transistors, this well 108 being isolated from the P-type substrate 101 by an oxide layer 105.

In this alternative embodiment, the NMOS transistors contained in the well 108 of the P-type can be operated on different voltages from those on which the NMOS transistors contained in the substrate portion 101a of the P-type are operated. This embodiment will, therefore, is advantageous especially where a capability to operate on different reference voltages, or on negative voltages, is required; for example in memories of the Flash or the EEPROMs type.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A process for manufacturing SOI circuit structures integrated on a semiconductor substrate having a first conductivity type, said strucoas being able to accommodate electronic devices in a substrate portion, the process comprising:

forming a first well with a second conductivity type in said semiconductor substrate;

forming a hole in said first well the hole having a first surface;

coating said hole with an insulating coating layer;

forming an opening through said insulating coating layer at the first surface of the hole;

filling the hole with an epitaxial layer grown from a seed made accessible through said opening; and forming a second well between said epitaxial layer and said insulating coating layer which has the same type of conductivity as the semiconductor substrate.

2. The manufacturing process according to claim 1 wherein said epitaxial layer has the same type of conductivity as the substrate.

3. The manufacturing process according to claim 1, further comprising planarizing said epitaxial layer to be level with a surface of the substrate.

4. The manufacturing process according to claim 3, wherein planarizing said epitaxial layer comprises Chemical-Mechanical Polishing said epitaxial layer.

5. A process for manufacturing SOI circuit structures integrated on a semiconductor substrate having a first conductivity type, said structures being able to accommodate electronic devices in a substrate portion, the process comprising:

forming at least one well with a second conductivity type in said semiconductor substrate;

forming a hole in said at least one well, the home having a first surface;

coating said hole with an insulating coating layer;

forming an opening through said insulating coating layer at the first surface of the hole;

filling the hole with an epitaxial layer grown from a seed made accessible through said opening; and digging an isolating trench into said epitaxial layer at said opening.

6. The manufacturing process according to claim 1 wherein coating said hole with an insulating coating layer comprises forming a silicon oxide layer in said hole.

7. The manufacturing process according to claim 1 wherein the first type of conductivity is an N type of conductivity.

8. A method for manufacturing SOI circuit structures integrated on a semiconductor substrate having a first conductivity type, the method comprising:

forming a well with a second conductivity type in the semiconductor substrate;

etching a first portion of the semiconductor substrate to form a hole in the well, the hole having a first surface;

coating the first surface of the hole with an insulating layer;

forming an opening through the insulating layer at the first surface of hole;

growing an epitaxial layer of semiconductor substrate within the hole; and forming an isolation trench within the epitaxial layer.

9. The method of claim 8 further comprising covering the semiconductor substrate with a covering insulating layer and wherein growing an epitaxial layer of semiconductor substrate comprises growing an epitaxial layer that fill the hole and covers the covering insulating layer.

10. The method of claim 8 further comprising recrystallizing the epitaxial layer of semiconductor substrate.

11. The method of claim 8 further comprising, prior to forming an isolation trench:

forming a region within the well, the region having the first conductivity type;

forming a second epitaxial layer over the substrate.

12. The method of claim 11 wherein the second epitaxial layer has the first type of conductivity, and further comprising doping the second epitaxial layer with the second conductivity type adjacent to the well.

13. The method of claim 8 further comprising forming a second well with the first conductivity type in the semiconductor substrate.

14. The method of claim 8 further comprising planarizing the epitaxial layer to be level with a surface of the substrate.

15. The manufacturing process according to claim 1, further comprising forming at least one other well with the second conductivity type in said semiconductor substrate, said at least one other well having no holes structured to provide dielectrically isolated regions.

16. The method of claim 8, wherein the isolation trench is formed at the opening.

17. A method for manufacturing SOI circuit structure integrated on a semiconductor substrate having a first conductivity type, the method comprising:

etching a first portion of the semiconductor substrate to form a hole defined by a first surface;

coating the first surface with an insulating layer, forming an opening through the insulating layer at the first surface;

growing a first epitaxial layer of semiconductor substrate within the hole; and forming an isolation trench in the first epitaxial layer within the hole.

18. The method of claim 17, further comprising:

forming a first well with a second conductivity type in the semiconductor substrate, the hole being formed in the well;

forming second and third wells in the first epitaxial layer within the hole prior to forming the isolation trench between the second and third wells, the second and third wells having the first conductivity type.

19. The method of claim 18, further comprising prior to form the isolation trench:

forming a second epitaxial layer, having the first type of conductivity, on the first epitaxial layer and the first well; and doping the second epitaxial layer above peripheral areas of the first well with the second conductivity type, thereby forming a central well of the first conductivity type above the second and third wells.

20. The method of claim 17, further comprising planarizing the first epitaxial layer to be level with a surface of the substrate.

* * * * *

UNITED STATES PATENT AND TRADEMARK OFFICE
CERTIFICATE OF CORRECTION

PATENT NO.   : 6,410,404 B1
DATED        : June 25, 2002
INVENTOR(S)  : Raffaele Zambrano It is certified that error appears in the above-identified patent and that said Letters Patent is hereby corrected as shown below:

Column 5,
Line 4, "said strucoas being able to" should read as -- said structures being able to --.
Lines 36 and 37, "the home having a first surface;" should read as -- the hole having a first surface --.
Line 62, "surface of hole;" should read as -- surface of the hole; --.

Column 6,
Line 5, "layer that fill the hole" should read as -- layer that fills the hole --.
Lines 7 and 8, "comprising recrystallizing" should read as -- comprising re-crystrallizing --.
Lines 12 and 13, "conductivity type; forming" should read as -- conductivity type; and forming --.
Line 30, "SOI circuit structure" should read as -- SOI circuit structures --.
Lines 51 and 52, "prior to form the isolation trench:" should read as -- prior to forming the isolation trench: --.

Signed and Sealed this

Fifth Day of November, 2002

Attest:

Attesting Officer

JAMES E. ROGAN
*Director of the United States Patent and Trademark Office*